(12) United States Patent
Stuart et al.

(10) Patent No.: US 11,852,692 B1
(45) Date of Patent: Dec. 26, 2023

(54) ELECTRIC DISTRIBUTION LINE GROUND FAULT PREVENTION SYSTEMS USING DUAL PARAMETER MONITORING WITH HIGH SENSITIVITY RELAY DEVICES

(71) Applicants: Robert B. Stuart, San Tan Valley, AZ (US); Ronald E. Smith, Antioch, CA (US)

(72) Inventors: Robert B. Stuart, San Tan Valley, AZ (US); Ronald E. Smith, Antioch, CA (US)

(73) Assignee: MILO GROUP LLC, Casper, WY (US)

( * ) Notice: Subject to any disclaimer, the term of this patent is extended or adjusted under 35 U.S.C. 154(b) by 0 days.

(21) Appl. No.: 18/064,152

(22) Filed: Dec. 9, 2022

(51) Int. Cl.
  *G01R 31/52* (2020.01)
  *H03K 19/20* (2006.01)
  *G01R 31/08* (2020.01)

(52) U.S. Cl.
  CPC ........... *G01R 31/52* (2020.01); *G01R 31/085* (2013.01); *G01R 31/086* (2013.01); *H03K 19/20* (2013.01)

(58) Field of Classification Search
  CPC .... G01R 31/52; G01R 31/085; G01R 31/086; H03K 19/20
  See application file for complete search history.

(56) References Cited

U.S. PATENT DOCUMENTS

| 2,942,122 A | * | 6/1960 | Anderson | H02J 3/38 361/54 |
| 3,735,201 A | * | 5/1973 | May | H02H 7/222 361/87 |
| 4,698,718 A | * | 10/1987 | Chow | H02H 7/06 361/84 |

(Continued)

OTHER PUBLICATIONS

W. O'Brien, E. Udren, K. Garg, D. Haes, B. Sridharan, "Catching falling conductors in midair—detecting and tripping broken distribution circuit conductors at protection speeds," 2016 69th Annual Conference for Protective Relay Engineers (CPRE), College Station, TX, USA, 2016, 13 pages, doi: 10.1109/CPRE.2016.7914881.

(Continued)

*Primary Examiner* — Patrick Assouad
*Assistant Examiner* — Demetrius R Pretlow
(74) *Attorney, Agent, or Firm* — Wilkinson Law Office; Clinton H. Wilkinson

(57) ABSTRACT

A system for preventing ground fault in a three-phase electric distribution line system caused by a line break, includes: the transmission lines, a programmable relay protection system, including high sensitivity. The HS relays on each line are programmed to include: preset acceptable operating parameter ranges of at least two electric operating conditions, namely, high sensitivity instantaneous undercurrent and at least one high sensitivity negative sequence overcurrent; monitoring; permitting closed circuit operation when all of the lines show that the two operating conditions are within the preset acceptable operating parameter ranges;

(Continued)

tripping a circuit breaking device on a broken line when that line shows that the two operating conditions are outside the preset parameter ranges; and shutting down power to the broken line before it otherwise causes a ground fault or other short circuit. A third parameter monitoring: rate of change in current is preferred.

20 Claims, 13 Drawing Sheets

(56) References Cited

U.S. PATENT DOCUMENTS

| | | | |
|---|---|---|---|
| 4,757,416 A | | 7/1988 | Wilkerson |
| 4,788,619 A | | 11/1988 | Ott et al. |
| 5,014,153 A | | 5/1991 | Wilkerson |
| 5,245,261 A | * | 9/1993 | Ashley ................ H01L 29/1075 361/87 |
| 5,309,312 A | | 5/1994 | Wilkerson et al. |
| 5,640,060 A | | 6/1997 | Dickson |
| 5,751,532 A | | 5/1998 | Kanuchok et al. |
| 5,761,073 A | | 6/1998 | Dickson |
| 6,518,767 B1 | | 2/2003 | Roberts et al. |
| 7,345,456 B2 | | 3/2008 | Gibbs et al. |
| 8,866,626 B2 | | 10/2014 | Kim |
| 9,007,731 B2 | | 4/2015 | Finney et al. |
| 9,753,096 B2 | | 9/2017 | Kim |
| 10,197,614 B2 | | 2/2019 | Benmouyal et al. |
| 10,340,684 B2 | | 7/2019 | Sridharan et al. |
| 10,823,777 B2 | | 11/2020 | Dase et al. |
| 10,955,455 B2 | | 3/2021 | Thompson et al. |
| 11,211,788 B2 | | 12/2021 | Wade et al. |
| 2003/0039086 A1 | * | 2/2003 | Kase ................ H02H 3/40 361/65 |
| 2004/0130839 A1 | * | 7/2004 | Bo ................ H02H 7/30 361/92 |
| 2006/0268484 A1 | | 11/2006 | Thurk et al. |
| 2007/0236208 A1 | * | 10/2007 | Kojovic ................ G01R 15/181 324/127 |
| 2015/0346266 A1 | * | 12/2015 | Dimino ................ G01R 31/086 702/59 |
| 2019/0109451 A1 | | 4/2019 | Takemura et al. |
| 2019/0317143 A1 | | 10/2019 | Dase et al. |
| 2019/0324074 A1 | | 10/2019 | Thompson et al. |
| 2021/0048486 A1 | | 2/2021 | Bell et al. |
| 2021/0091559 A1 | | 3/2021 | Mobley et al. |
| 2021/0265834 A1 | | 8/2021 | Wade et al. |
| 2022/0236339 A1 | * | 7/2022 | Davarpanah ........... G01R 31/62 |

OTHER PUBLICATIONS

K. Dase, S. Harmukh, A. Chatterjee, "Detecting and Locating Broken Conductor Faults on High-Voltage Lines to Prevent Autoreclosing Onto Permanent Faults," Oct. 22-24, 2019 46th Annual Western Protective Relay Conference Spokane, Washington, 20 pages.

* cited by examiner

ELECTRIC DISTRIBUTION LINE GROUND FAULT PREVENTION SYSTEMS USING DUAL PARAMETER MONITORING WITH HIGH SENSITIVITY RELAY DEVICES

REFERENCE TO RELATED APPLICATIONS

There are no related applications.

BACKGROUND OF INVENTION a. Field of Invention

Three phase electric distribution systems are prone to failing lines that cause ground faults or other short circuits. Most three phase distribution lines also have branches to serve residential-type needs, and these are single phase "tap" lines. Typically, the failures result from breaks in an individual line, connection breaks, object intersection, aging, adverse weather, support structure failure, etc. For example, such lines that were built decades ago have aged to the point where conductors (lines) separate from splices, or otherwise break and open with dangling wires (jumpers). These double jumpers may slap against poles with conduits or otherwise ground to cause fires and/or injury to structures, persons, animals and wildlife and flora.

Historically, the industry has focused attention to preservation of distribution lines, transformers, generators and substations by monitoring systems for shorts and ground faults, reacting according to the concept of best methods for preserving equipment and maintaining best (least interrupted) services to the load (consumers). Thus, for decades and presently, the industry utilizes preprogrammed relays that monitor operating conditions to identify shorts and to shut down electricity on the shorted line and isolate to provide electricity to the consumer. These relays react once a ground fault or other short has occurred. These prior art relays have a sensitivity of about 1 amp, generally being about 0.5 amps sensitivity, and not as low as 0.1 amps sensitivity. These "low sensitivity" relays are incapable of sensing, much less monitoring, parameters that operate (flow) at lower amps than these low sensitivity limited relays. The present invention is directed to a very different approach—the use of methods, devices and systems that focus on identifying a break in a line before a short or ground fault occurs, thereby preventing disasters that may result from such shorts and ground faults. There are about 1.3 to 1.7 seconds between the time a line breaks and the time a short occurs (i.e., the time it takes to touch a foreign conductor, such as ground, pole, building or other object). The present invention is directed to unique systems and devices to see the break in real time within fractions of a second, even milliseconds, and to likewise shut down the line (trip the circuit breaking device) within fractions of a second and, hence, before any short occurs, avoid many possible disasters. This is achieved by micro-monitoring, looking at different parameters (operating conditions) from those used in the prior art relays, and reacting nearly instantaneously. Specifically, in the field on the distribution system, relays high sensitivity relays are positioned to monitor very low flow rate parameter functions to prevent ground fault disasters. "High sensitivity" relays as used herein means relays that can measure/monitor parameters at 0.1 amps or lower, such as 0.05 amps or lower. Preferred are high sensitivity relays that can operate as low as 0.01 amps and most preferred are relays that can operate at or below 0.001 amps. For the usual distribution system that has the primary three phase lines and secondary tap lines (single phase) the present invention contemplates two different sets of parameters being measured, as well as preferred additional monitoring to eliminate false conclusions about whether or not a line has broken.

b. Description of Related Art

The following patents are representative of prior art of interest to the present invention:

U.S. Pat. No. 6,518,767 to Roberts et al. describes a power line current differential protection system. All three phase current values ($I_A$, $I_B$ and $I_C$) are obtained from both the local end and the remote end of a power transmission line. The magnitude of the ratio of the remote current values to the local current values are calculated. Also, the angle difference between the local and the remote current values for each phase are calculated. Comparison elements then compare the ratio and angle values against preselected values which establish a restrain region in the current ratio plane. Current values which result in the ratio being within the region do not result in a tripping signal for the circuit breaker on the power transmission line, while current values which result in a ratio outside of the region result in a tripping of the circuit breaker. Similar circuitry is used for negative sequence current quantities, with the negative sequence preselected values being set substantially lower to produce a more sensitive response to possible faults in the line.

U.S. Pat. No. 10,197,614 to Benmouyal et al. illustrates the errors that are encountered when using both single-ended and double-ended normal-mode fault location calculations when a fault occurs in a pole-open condition. The disclosure provides systems and methods for accurately calculating the location of faults that occur during pole-open conditions, including single-ended approaches and double-ended approaches.

U.S. Pat. No. 10,340,684 to Sridharan et al. describes how a location of a broken electrical conductor of an electric power delivery system may be detected by monitoring a rate of change of phase voltage and/or a rate of change of zero-sequence voltage at various points on the conductor. Intelligent electronic devices (IEDs) such as phasor measurement units may be used to obtain measurements and calculate synchrophasors. The synchrophasors may be used by a central controller to determine which two continuous IEDs measure rates of change of voltages of opposite polarities, where the broken conductor is between the two continuous IEDs. The synchrophasors may be used by a central controller to determine which two continuous IEDs where one exhibits a zero-sequence voltage magnitude that exceeds a predetermined threshold for a predetermined time, wherein the zero-sequence voltage magnitude of the other of the continuous IEDs does not exceed the predetermined threshold.

U.S. Pat. No. 10,823,777 to Dase et al. relates to detecting a broken conductor in a power transmission line. In an embodiment, a processor receives a signal indicating current on the transmission line. The processor determines that a broken conductor is present on the transmission line based at least in part on a magnitude of the current being less than a line charging current of the transmission line and a phase angle of the current leading a respective phase voltage of the transmission line. The processor effects a control operation based on the determined broken conductor.

U.S. Pat. No. 10,955,455 to Thompson et al. pertains to detection of a broken conductor in an electric power system.

In one embodiment, a broken conductor detector may be configured to be mounted to an electrical conductor and may comprise a communication subsystem configured to transmit a signal configured to indicate that the conductor is broken. A sensor may determine an operating vector. A processing subsystem may be configured to receive the operating vector from the sensor and to identify when the operating vector is outside of a range defined by a rest vector and a threshold value. In certain embodiments, the threshold may comprise a three-dimensional sphere. The processing subsystem may determine that the conductor is broken based on the operating vector remaining outside of the range for a period of time determined by the timer subsystem. A signal may be transmitted by the communication subsystem to indicate that the conductor is broken.

U.S. Pat. No. 11,211,788 to Wade et al. describes how systems and methods may mitigate risk of fire caused by an electric power system. In one embodiment, a system may include an intelligent electronic device (IED). The IED includes a communication subsystem to receive a signal from a sensor related to a condition of the electric conductor. A processing subsystem in communication with the communication subsystem may operate in at least two modes comprising a high security mode and a fire prevention mode. In the fire prevention mode, the IED may interrupt a flow of electric current based on the signal from the at least one sensor associated with the electric conductor. In the high security mode, the system may interrupt a flow of electric current based on the signal from the at least one sensor associated with the electric conductor and based on a second condition relating to the electric conductor.

U.S. Publication No. 20190317143 to Gangadhar et al. relates to detecting a broken conductor in a power transmission line. In an embodiment, a processor receives a signal indicating current on the transmission line. The processor determines that a broken conductor is present on the transmission line based at least in part on a magnitude of the current being less than a line charging current of the transmission line and a phase angle of the current leading a respective phase voltage of the transmission line. The processor effects a control operation based on the determined broken conductor.

U.S. Publication No. 20190324074 to Thompson et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine an operating vector. A processing subsystem may be configured to receive the operating vector from the sensor and to identify when the operating vector is outside of a range defined by a rest vector and a threshold value. In certain embodiments, the threshold may comprise a three-dimensional sphere. The processing subsystem may determine that the conductor is broken based on the operating vector remaining outside of the range for a period of time determined by the timer subsystem. A signal may be transmitted by the communication subsystem to indicate that the conductor is broken.

U.S. Publication No. 20210048486 to Bell et al. describes systems for determining a broken conductor condition in a multiple-phase electric power delivery system. It has been observed that broken conductors pose a safety concern when occurring in the presence of people or vulnerable environmental conditions. Broken conductor conditions disclosed herein may be used to detect and trip the phase with the broken conductor, thus reducing or even eliminating the safety risk. Further, a distance to the opening may be determined.

U.S. Publication No. 20210091559 to Mobley et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine a plurality of vectors. A processing subsystem may be configured to receive the plurality of vectors from the sensor and to identify when the vector is outside of a range defined by a threshold value. The processing subsystem may determine that the conductor is falling based on the plurality of vectors remaining outside of the threshold for a period of time determined by the timer subsystem. A signal may be transmitted by the communication subsystem to indicate that the conductor is falling.

U.S. Publication No. 20210265834 to Wade et al. describes how systems and methods may mitigate risk of fire caused by an electric power system. In one embodiment, a system may include an intelligent electronic device (IED). The IED includes a communication subsystem to receive a signal from a sensor related to a condition of the electric conductor. A processing subsystem in communication with the communication subsystem may operate in at least two modes comprising a high security mode and a fire prevention mode. In the fire prevention mode, the IED may interrupt a flow of electric current based on the signal from the at least one sensor associated with the electric conductor. In the high security mode, the system may interrupt a flow of electric current based on the signal from the at least one sensor associated with the electric conductor and based on a second condition relating to the electric conductor.

Published article 2016 IEEE "Catching Falling Conductors in Midair—Detecting and Tripping Broken Distribution Circuit Conductors at Protection Speeds" by William O'Brien, Eric Udren, Kamal Garg, Dennis Haes, and Bala Sridharan describes how when an overhead electric power distribution circuit conductor breaks—for example, when a car strikes a pole or a splice or clamp fails—the energized conductor falls to ground. The resulting high-impedance ground fault may be difficult or impossible to detect by relays located in the substation. In any case, no ground fault protection relay can operate until well after the time the fault has occurred—after the falling energized conductor has hit the ground and created a hazardous situation. For decades, utilities and equipment manufacturers have worked to develop methods for tripping these hazardous ground faults as quickly as possible. This paper describes a new falling conductor detection scheme that trips the affected circuit section in the narrow time window between the moment of the break and the time the conductor hits the ground. The affected circuit section is de-energized while the conductor is still falling, eliminating the risk of an arcing ground fault or energized circuits on the ground.

Published article 2019 Schweitzer Engineering Laboratories, Inc. "Detecting and Locating Broken Conductor Faults on High-Voltage Lines to Prevent Autoreclosing Onto Permanent Faults" by Kanchanrao Dase, Sajal Harmukh, and Arunabha Chatterjee describes how broken-conductor detection is challenging because the conductor may remain suspended without causing any fault current. Even if the conductor falls to the ground, the fault current might remain low, depending on the fault resistance. For low-resistance faults, a relay can detect faults and trip the line breakers.

However, because the relay cannot determine whether the fault is permanent, it may attempt to reclose, causing further stress to the power system. This paper describes a new algorithm that uses only single-ended measurements to reliably detect broken conductors and estimate their location by using the charging current of the line. The phase angle of this current leads the voltage by about <90°, and the magnitude is a function of line length. This method is suitable for power lines that have measurable charging current, and it detects broken conductors successfully if the relay can measure the charging current while the conductor is falling in midair. Broken-conductor detection can be used to trip the breakers before the conductor touches the ground and creates a shunt fault. Thus, the algorithm can prevent such faults and block any attempt to reclose the line. Detecting broken conductors and their location information provided by the algorithm can help in quickly resolving broken-conductor faults. This paper presents three field events from 57.1 kV and 220 kV lines and results from Electromagnetic Transients Program (EMTP) simulations that validate the algorithm.

U.S. Pat. No. 9,753,096 to Kim and related U.S. Pat. No. 8,866,626 to Kim both describe a method, system and computer software for detecting an incipient failure of a generator in a power system including the steps of ascertaining one or more generator reference parameter of the generator for use as a baseline reference; measuring one or more operating parameter values of the generator; using the one or more operating parameter values to solve for an estimated present value of the one or more of the generator's current performance parameters using particle swarm optimization technique; and determining whether the estimated present values of the one or more of the generator's current performance parameters are outside of an acceptable limit.

U.S. Pat. No. 7,345,456 to Gibbs et al. describes a stabilizer and synchronous electric power generator system using same that provides both power system damping and excitation limiter functionality. The stabilizer includes a processing unit and a memory storing routines executable by the processing unit. The routines are adapted to receive a voltage signal indicative of a voltage and a current signal indicative of a current output by the generator system, generate, utilizing the voltage and current signals, a power system stabilizer signal for damping oscillations and one or more excitation limiter function signals for controlling excitation level. The routines are also adapted to generate a feedback signal for the generator system by combining the power system stabilizer signal and one or more of the one or more excitation limiter function signals.

U.S. Pat. No. 5,761,073 to Dickson describes a programmable autosynchronizer for use with a system having generator and bus voltages and having a breaker circuit for connecting the generator and bus voltages to each other. The autosynchronizer synchronizes the frequency and phase of the generator and bus AC voltages by controlling the generator voltage. A microprocessor compares the frequencies of generator and bus voltage signals, the microprocessor generating a proportional difference signal having a parameter representative of a proportional difference in frequency between the generator and bus voltage signals. The proportional correction range extends within the synchronization range. The microprocessor permits a sync signal when the frequency difference of the frequencies of the generator and bus voltage signals is within the synchronization frequency range. A first output circuit responsive to the proportional difference signal provides a correction signal to the generator for varying the frequency of the generator. A second output circuit responsive to the sync signal provides a breaker close signal to the breaker circuit for closing the breaker thereby enabling connection of the generator and bus voltages. A frequency correction dead band within the frequency range and a target slip band within the dead band define a zone of limited proportional correction to nudge the generator into synchronization and prevent a hung scope.

U.S. Pat. No. 5,751,532 to Kanuchok, et al. describes a relay for monitoring an electrical system to protect the electrical system from an overcurrent condition as a time dependent function of an electrical current level in the electrical system is disclosed. The relay includes a memory which stores a current level count and a current level detector coupled to the electrical system which detects the electrical current level in the electrical system over time. A microprocessor responds to the current level detector by varying the current level count in the memory as a function of the electrical current level over time. The microprocessor also detects an occurrence of the electrical current level falling below a minimum current level. A timer responds to the microprocessor by measuring a period of time during which the electrical current level is less than the minimum current level. The microprocessor responds to the timer by varying the current level count in the memory as a function of the measured period of time during which the electrical current level is below the minimum current level. A method of monitoring an electrical system to protect the electrical system from an overcurrent condition as a time dependent function of an electrical current level in the electrical system is also disclosed. Other apparatus and methods are also disclosed.

U.S. Pat. No. 5,640,060 to Dickson describes an autosynchronizer for use with a system having generator and bus voltages and having a breaker circuit for connecting the generator and bus voltages to each other. The autosynchronizer synchronizes the frequency and phase of the generator and bus AC voltages by controlling the generator voltage. A microprocessor compares the frequencies of generator and bus voltage signals, the microprocessor generating a proportional difference signal having a parameter representative of a proportional difference in frequency between the generator and bus voltage signals. The proportional correction range extends within the synchronization range. The microprocessor permits a sync signal when the frequency difference of the frequencies of the generator and bus voltage signals is within the synchronization frequency range. A first output circuit responsive to the proportional difference signal provides a correction signal to the generator for varying the frequency of the generator. A second output circuit responsive to the sync signal provides a breaker close signal to the breaker circuit for closing the breaker thereby enabling connection of the generator and bus voltages. A frequency correction dead band within the frequency range and a target slip band within the dead band define a zone of limited proportional correction to nudge the generator into synchronization and prevent a hung scope.

U.S. Pat. No. 5,309,312 to Wilkerson, et al. describes an apparatus for protecting an electrical power system supplying electrical power to an electrical load comprises a transformer for sensing an operating condition of the electrical power system and for producing an analog signal representative of the operating condition, and a microcomputer for periodically sampling the analog signal and for converting the analog signal into a series of digital signals. The microcomputer includes circuitry for deriving a digital value representative of a square root of the series of digital signals and circuitry for processing the digital value over time to determine a processed value which is a function of both the sensed operating condition and time. A circuit breaker is responsive to the microcomputer for disconnecting the power system from the load in the event that the processed value is not within preset limits. The microcomputer also generates a relay signal representative of the status of the relay and the relay includes an output port responsive to the relay signal, for communicating the status of the relay to a remote station.

U.S. Pat. No. 5,014,153 to Wilkerson describes an apparatus for monitoring phased currents in a first winding and a second winding of a transformer and for disconnecting the transformer from a power source supplying the transformer when a difference between the magnitude of the current in the first winding and the magnitude of the current in the second winding exceeds a predetermined amount to indicate a fault condition is disclosed. The apparatus is used in combination with circuitry for generating first and second current signals each having a phase and magnitude which is a function of the phase and magnitude of the phased currents in the first and second windings, respectively. The apparatus includes a circuit for shifting the phase of the second current signal to match the phase of the first current signal, a circuit for detecting a difference between the magnitude of the first current signal and the magnitude of the phase shifted second current signal, and a circuit for disconnecting the transformer from the power source when the detected difference exceeds the predetermined amount.

U.S. Pat. No. 4,788,619 to Ott, et al. describes a protective relay for use in an electrical power system having electrical conductors which are energized with an AC voltage. The protective relay includes a circuit for sensing the AC voltage to produce an AC output that has zero crossings and a time period between zero crossings, a circuit for supplying an electrical signal representing a preselected pickup value of volts-per-Hertz for the relay, and a circuit responsive to the AC output and to the electrical signal for generating an electrical level as a function of both the time period and the pickup value and for producing an output signal for the relay when the AC output exceeds the electrical level. In this way, the output signal is produced when a volts-per-Hertz value of the AC voltage exceeds the preselected pickup value of volts-per-Hertz for the relay. Other protective relay apparatus and methods are also disclosed.

U.S. Pat. No. 4,757,416 to Wilkerson describes a protective apparatus for use in an A.C. electrical power system with a circuit breaker for connecting and disconnecting first and second electrical conductors that are electrically energized, the conductors normally having a negligible phase difference of electrical energization when the circuit breaker is closed, and the circuit breaker having auxiliary contacts defining the state of the circuit breaker as open or closed. The protective apparatus includes a circuit responsive to the auxiliary contacts for producing a first signal representative of the state of the breaker as open or closed and another circuit connected to the circuit for producing the first signal and operable when the breaker is closed for generating a second signal when the phase difference of electrical energization of the first and second electrical conductors exceeds a predetermined value. A further circuit provides an indication of malfunction of the circuit breaker when the second signal occurs. Phase window extending apparatus for use in the protective apparatus, methods of operation and other protective apparatus are also disclosed.

In addition to the above, there are non-analogous art teachings that touch upon control systems for power converters, and other electric equipment, that rely upon predetermined fixed level parameters. United States Patent Application Publication 20220085713 A1 to Clemens et al. describes a drive system that includes a power converter in which the control system includes a predefined fixed level selected from the group of: fixed over speed, fixed under speed, fixed undercurrent, fixed under power, fixed torque pulsation, fixed negative sequence overcurrent, fixed thermal overload, fixed resistance temperature detector protection, fixed instantaneous overcurrent, fixed zero sequence over voltage, fixed inverse time overcurrent, fixed instantaneous zero sequence over voltage, fixed maximum power factor, fixed minimum power factor, fixed over frequency, fixed under frequency, fixed high frequency rate of change and combinations thereof. However, this reference does not specifically call out the two parameters of the present invention and it is not directed to electric power lines.

Notwithstanding the prior art, the present invention is neither taught nor rendered obvious thereby.

SUMMARY OF THE INVENTION

The present invention involves an enhanced manner in which to monitor three-phase electric distribution line systems by measuring specific high sensitivity parameters with high sensitivity relays that are installed in the system.

Thus, the present invention is a system for preventing ground fault or other short circuit in an electric distribution line system, caused by a break in a line, which utilizes at least dual high sensitivity monitoring. This invention includes: A. a three-phase electric distribution line system having a plurality of circuit breaking devices and transformers; B. a plurality of relay devices connected to the distribution line system, the plurality of relay devices having a best sensitivity for measuring line instantaneous undercurrent of at least 0.01 amps or lower amps, and thereby being high sensitivity relay devices, wherein at least some of the plurality of relay devices are connected to at least some of the plurality of circuit breaking devices; C. a programmable relay protection system functionally connected to the three-phase electric distribution line system, including functionally connected to the plurality of relay devices on each line of the electric distribution line system, the relay protection system being programmed to include monitoring of specific parameters. These include: (a) preset parameter ranges of at least two high sensitivity electric operating conditions, the preset ranges being acceptable operating parameter ranges, one of the operating conditions being instantaneous undercurrent, and one other of the operating conditions being negative sequence overcurrent; (b) monitoring means to monitor each line at each of the plurality of relay devices for the at least two operating conditions; (c) permitting closed circuit operation when all of the lines show the at least two operating conditions are within the preset acceptable operating parameter ranges; (d) sensing open conductor broken line changes and tripping a circuit breaking device on a broken line when that line shows the at least two operating conditions are outside the preset parameter ranges; (e) and completing the sensing and tripping within 1.0 second.

In some embodiments of the present invention system for preventing ground fault or other short circuit in a three-phase electric distribution line system, some of the relays are connected to the circuit breaking device selected from the group consisting of substation circuit breakers, non-substation circuit breakers, line reclosers, tap lines and combinations thereof.

In some preferred embodiments, the preset parameter ranges of at least two high sensitivity electric operating conditions are three preset parameter ranges, the three preset ranges being acceptable operating parameter ranges of (i) instantaneous undercurrent, (ii) negative sequence overcurrent, and (iii) rate of change of current.

In some preferred embodiments, the sensing and reporting and tripping of a circuit breaking device is completed within 1.0 second.

In some embodiments, the programmable relay protection system plurality of relay devices are programmed to monitor line high sensitivity instantaneous undercurrent, and to monitor high sensitivity negative sequence overcurrent to detect current imbalance of the load when one of the three phases has opened.

In some embodiments, shutting down the power to the broken line is delayed by a preset time within the range of about 0.3 seconds to about 1.0 second to protect against a false shut down.

In some embodiments, the plurality of relay devices is programmed to be highly sensitive so as to monitor and measure instantaneous undercurrent in the range of 0.01 to 1 amp. In some embodiments, the plurality of relay devices is programmed to be highly sensitive so as to monitor and measure negative sequence overcurrent in the range of 0.01 to 1 amp. In some embodiments, the plurality of relay devices are programmed to be highly sensitive so as to monitor and measure instantaneous undercurrent in the range of 0.01 to 1 amp.

In some preferred embodiments that include rate of changes of current, the rate of changes of current is measured in time increments of about 0.5 to about 1.2 seconds. In some preferred embodiments, the rate of changes of current is measured in time increments of about 0.8 to about 1.0 second.

In some embodiments of the present invention system for preventing ground fault or other short circuit in a three-phase electric distribution line system, the relay protection system includes sufficient software and hardware for recognizing line breakage within 10 milliseconds when the at least one operating condition falls outside of the preset parameter ranges, and communicating to open the circuit breaking device on the broken line within 10 milliseconds, thereby shutting down power to the broken line before it otherwise causes a ground fault or other short circuit.

In some preferred embodiments, the system for preventing ground fault or other short circuit in a three-phase electric distribution line system further includes single-phase tap lines, and the single phase tap lines are monitored lines wherein a plurality of additional relays are located on the single-phase tap lines, and further wherein the additional relays located on the single phase tap lines are programmed to monitor three preset parameter ranges, the three preset ranges being acceptable operating parameter ranges of (i) instantaneous undercurrent, (ii) instantaneous single phase overcurrent, and (iii) rate of change of current. On the tap line monitoring, the rate of changes of current is measured in time increments of about 0.5 to about 1.2 seconds. In preferred embodiments, the rate of changes of current is measured in time increments of about 0.8 to about 1.0 second.

As a feature of the present invention, AND and OR gates are utilized to control the incoming monitored parameters. In some embodiments, there are at least two AND gates and at least one OR gate for processing monitored data readings and tripping breakers, including a first AND gate that receives line instantaneous undercurrent readings and line negative sequence overcurrent readings, and includes a second AND gate that receives line instantaneous undercurrent readings and line instantaneous overcurrent readings with a different, second set of parameter ranges than the first AND gate. In some embodiments, there are at least three AND gates and at least one OR gate for processing monitored data readings and tripping breakers, including a first AND gate that receives line instantaneous undercurrent readings and line negative sequence overcurrent readings, and includes a second AND gate that receives line instantaneous undercurrent readings and line instantaneous overcurrent readings with a different, second set of parameter ranges than the first AND gate, and a third AND gate that receives at least two line parameters including a first line instantaneous undercurrent and a time-delayed second instantaneous undercurrent for monitoring rate of change of current. In some of these embodiments, the third AND gate also receives at least one additional line parameter, including instantaneous undercurrent readings.

In some preferred embodiments, there are at least four AND gates and at least one OR gate for processing monitored data readings and tripping breakers, including a first AND gate that receives line instantaneous undercurrent readings and line negative sequence overcurrent readings, and includes a second AND gate that receives line instantaneous undercurrent readings and line instantaneous overcurrent readings with a different, second set of parameter ranges than the first AND gate, and a third AND gate that receives at least two line parameters including a first line instantaneous undercurrent and a time-delayed second instantaneous undercurrent for monitoring the rate of change of current, and a fourth AND gate that receives line instantaneous undercurrent readings and line instantaneous overcurrent readings. In some of these embodiments, the third AND gate also receives at least one additional line parameter reading that includes instantaneous undercurrent readings.

BRIEF DESCRIPTION OF THE DRAWINGS

The accompanying drawings, which are included to provide a further understanding of the invention and are incorporated in and constitute a part of this specification, illustrate preferred embodiments of the invention and together with the detail description serve to explain the principles of the invention. In the drawings.

DETAILED DESCRIPTION OF THE INVENTION

Figure 1:
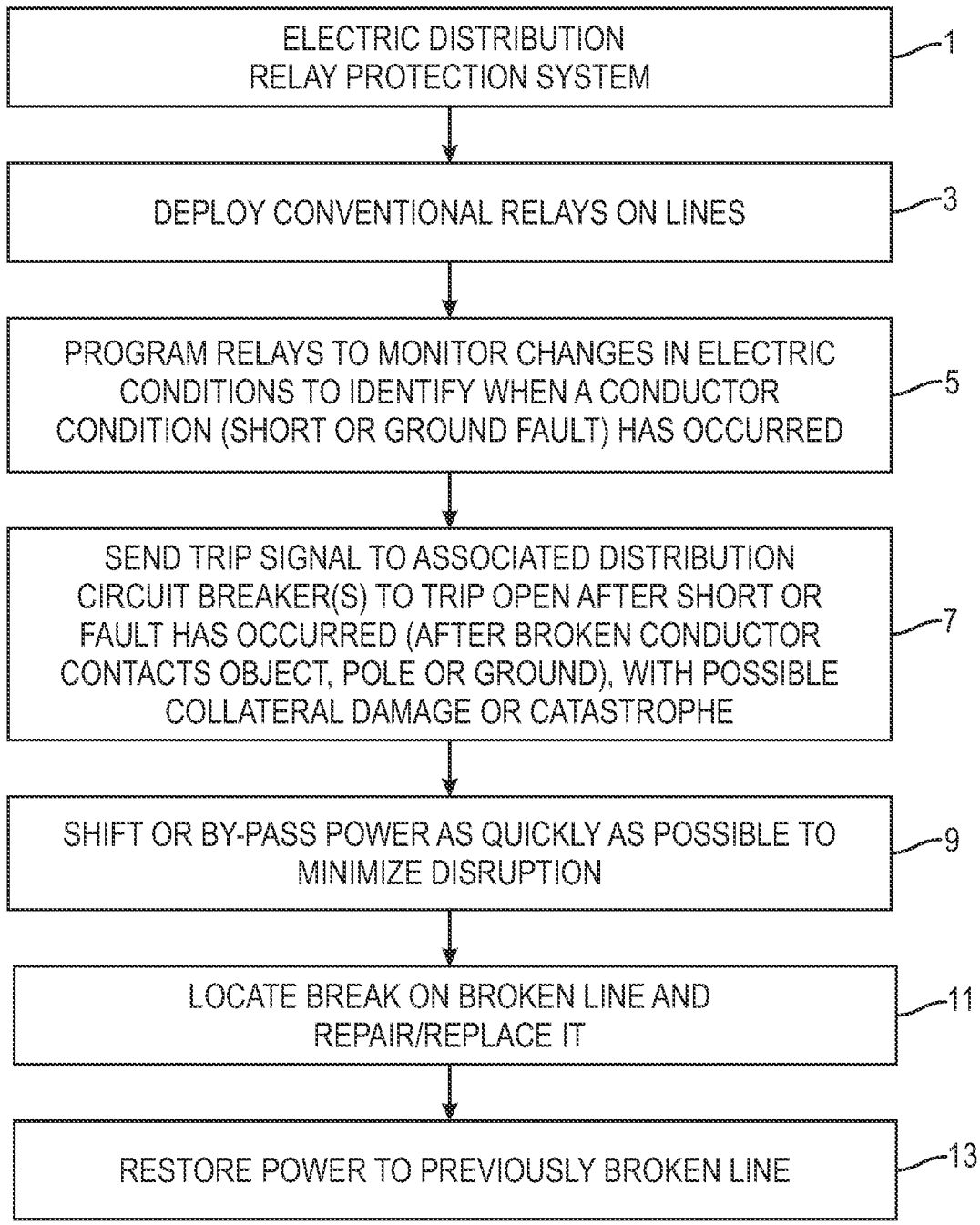
FIG. 1 is a block diagram showing some of the features of a Prior Art electric distribution relay protection system having low sensitivity relays.

Electricity begins with production of power, i.e. the source, in the form of any electric-producing-facility, fossil fuel power plant, hydroelectric, wind farm, solar form, hybrid, co-generation, etc. When electricity is produced, it is next distributed and then consumed. The four major aspects are production, transmission, distribution and consumption. Transmission usually begins with high voltage (sometimes called high tension) lines transmitting from the source, through the lines, to the load. Distribution involves step-down substations with transformers and other components to regulate electric flow. It is well known that resistance will cause huge drops in delivered electricity to the load, and it is well known that the negative effect of resistance along the lines (wires) can be significantly reduced by lowering the current and increasing the voltage. As an example, a 110 volt line could lose over 70% of its value before reaching a load, depending upon line material and distance, whereas high voltage lines operating at very high voltages, such as 345 kilovolts, might lose only 0.5% of its value to the load over many miles. When the transmission lines reach the distribution substations, the three phase distribution lines take over and distribute three phase electricity to consumers in need of three phase, such as industrial, commercial and institutional facilities, and then are further distributed to end user consumers, such as residences, with only single phase lines. The present invention is directed to detecting and shutting down open distribution lines before they ground, including both three phase and single phase lines (the latter sometimes referred to as tap lines) to prevent potentially catastrophic collateral damage, such as fires, electrocutions, etc. Unlike transmission lines, distribution lines have significantly different amperage flows, depending upon the location on the line. And further, there are additional significant differences between the three phase distribution line characteristics (parameters) and those of one phase lines, and the result is that no single monitored parameter has reliability, and multiple parameters must be simultaneously monitored to have significant reliability. The invention is truly a combination of invention components, one set for three different parameters for monitoring three phase, and a different set for monitoring single phase.

The term "ground fault" as used herein, is meant to reference a disruption caused by a live wire or other live electric component unintentionally contacting a conductor, such as a conductive structure, the ground, a body of water, etc. The term "broken line" as used herein shall be taken broadly to include live wires, live connectors, live splices and splice components that have experienced a break in the circuitry with a short or fault that has or is about to occur.

Referring now in detail to the drawings wherein like reference numerals designate corresponding parts throughout the several views, various embodiments of the present invention system are shown.

The standard in the industry is to monitor the distribution system to recognize a ground fault and to react to it using aforementioned low sensitivity relays. The conventional steps of the PRIOR ART are shown in FIG. 1, block 1 (Prior Art Electric Distribution Relay Protection System) are:

(1) deploy conventional low sensitivity (LS) relays along distribution lines, block 3;

(2) program these LS relays to monitor macro changes in electric conditions along the lines to identify when a ground fault has occurred, block 5;

(3) send a trip signal to the appropriate breaker to shut down the breaker after the ground fault has occurred, with possible collateral damage and possible catastrophic damage, block 7;

(4) shift power as quickly as possible to by-pass (isolate) the broken line to other transmission lines to minimize disruption, block 9 (this occurs with existing equipment and grid configurations as the transmission system reconfigures);

(5) locate the broken line and repair/replace it, block 11, and;

(6) restore power to the previously broken line, block 13.

This prior art procedure seems to be used frequently, if not universally, but has the disadvantage of collateral damage, ranging from minor property, livestock or flora and fauna damage, to significant collateral damage-fires, destruction and the like, to catastrophic collateral damage-loss life or many lives, destruction of valuable property, such as in the millions or even hundreds of millions of dollars, and even destruction of entire communities by fire. The parameters relied upon in these prior art systems are affected after a fault occurs, i.e., when it is too late to prevent collateral ground damage.

The present invention is directed to the elimination of all collateral and catastrophic damage caused by a short or ground fault in existing systems that presently use low sensitivity relays. This is achieved by utilizing micro monitoring programming in the high sensitivity relays to not look at ground faults, but to micro monitor small changes in characteristics that occur after a line is broken and before it shorts or grounds (that is, before it touches a pole, ground or other grounding object). "Micro" as used herein does not mean one millionth or other exact measurement, but rather is intended to connote very small measurements on a relative basis, such measurements involving characteristics for which flows are below 0.1 amps, and more specifically, those parameters set forth above and below. In this context, the present invention measurements are typically at least an order of magnitude smaller than present commercial relay measurements that occur upon a short or ground fault. For lower range high voltage systems, the present invention methods are monitoring conditions that are two or even three orders of magnitude smaller. Further, in the present invention methods, timing is critical and the conditions measured are different and critical. This unique approach enables circuit breaking devices to be shut down (and hence cease electric flow) before any collateral damage could otherwise occur.

Figure 2:
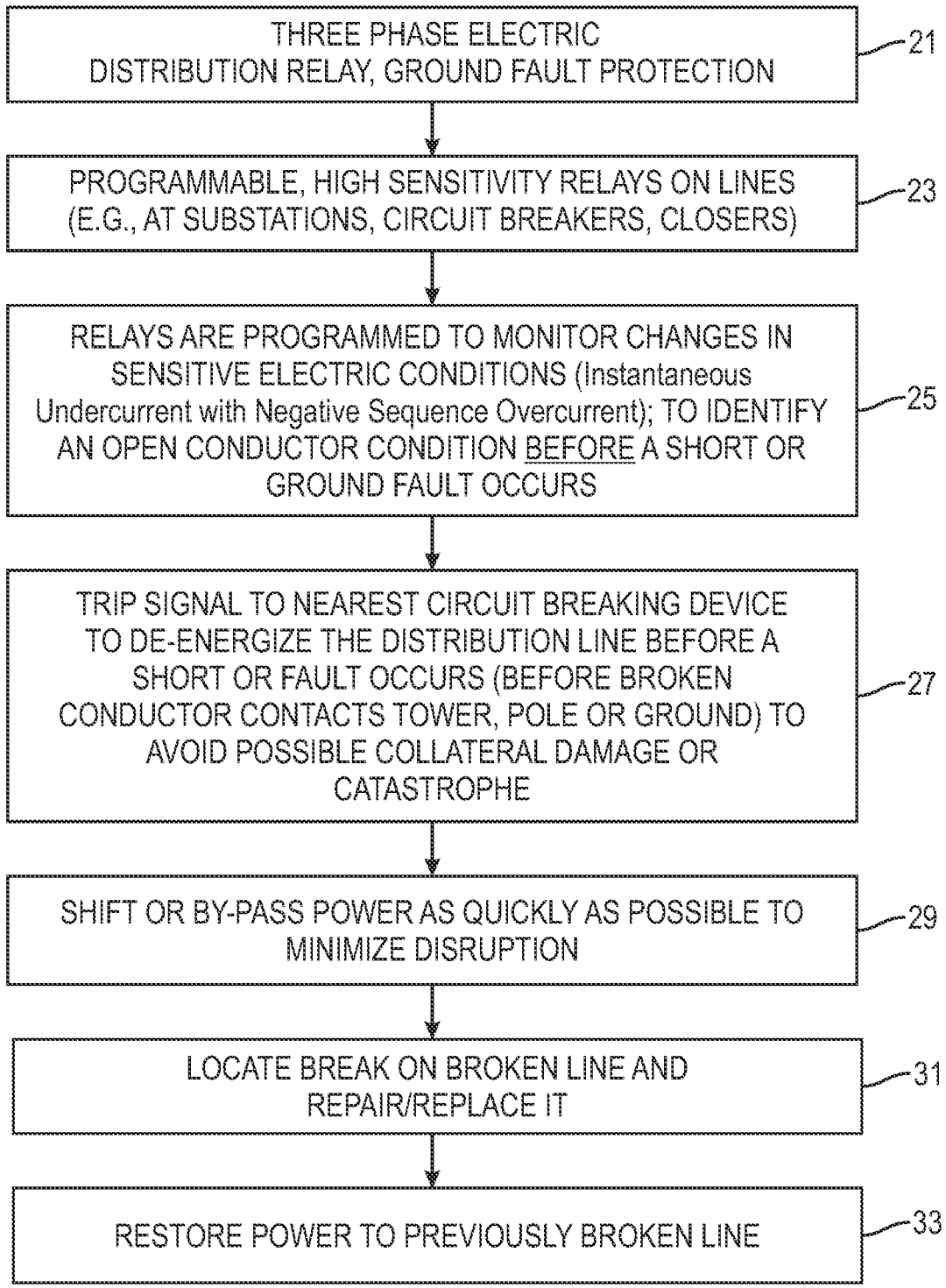
FIG. 2 is a block diagram showing some of the features of a Present Invention electric distribution relay protection system that includes high sensitivity relays with small change monitoring of selected parameters. The high sensitivity relays use micro monitoring of highly sensitive line conditions—namely, one of which is instantaneous undercurrent, and the other is negative sequence overcurrent.

FIG. 2 shows the steps in the present invention ground fault prevention system with its electric distribution relay protection system on a three-phase primary distribution line, block 21, and preferred embodiments include these steps:

(1) deploy programmable, high sensitivity relays along distribution lines, preferably at or near the substations, block 23. Signaling to circuit breaking devices must be very rapid, such as radio, direct wire or preferably optical fiber communications;

(2) program these high sensitivity relays to monitor micro changes in electric conditions, namely: a) instantaneous undercurrent; b) negative sequence overcurrent; and c) not shown in this Figure, but option yet preferred rate of change of current monitoring, along the three phase lines to identify when a line break has occurred and to do so before the broken line creates a fault, block 25, (before it touches a tower, pole or ground), e.g., within a half-second and preferably within a few milliseconds;

(3) rapidly signal to the appropriate circuit breaking devices to shut them down near the break before the ground fault has occurred, block 27 (again within a half-second and preferably within a few milliseconds) to avoid collateral damage or catastrophe, had the ground fault actually occurred;

(4) shift or by-pass (isolate) power as quickly as possible to minimize disruption, block 29 (this occurs with existing equipment and distribution configurations as the system may reconfigure);

(5) locate the broken line and repair/replace it, block 31, and;

(6) restore power to the previously broken line, block 33.

Figure 3:
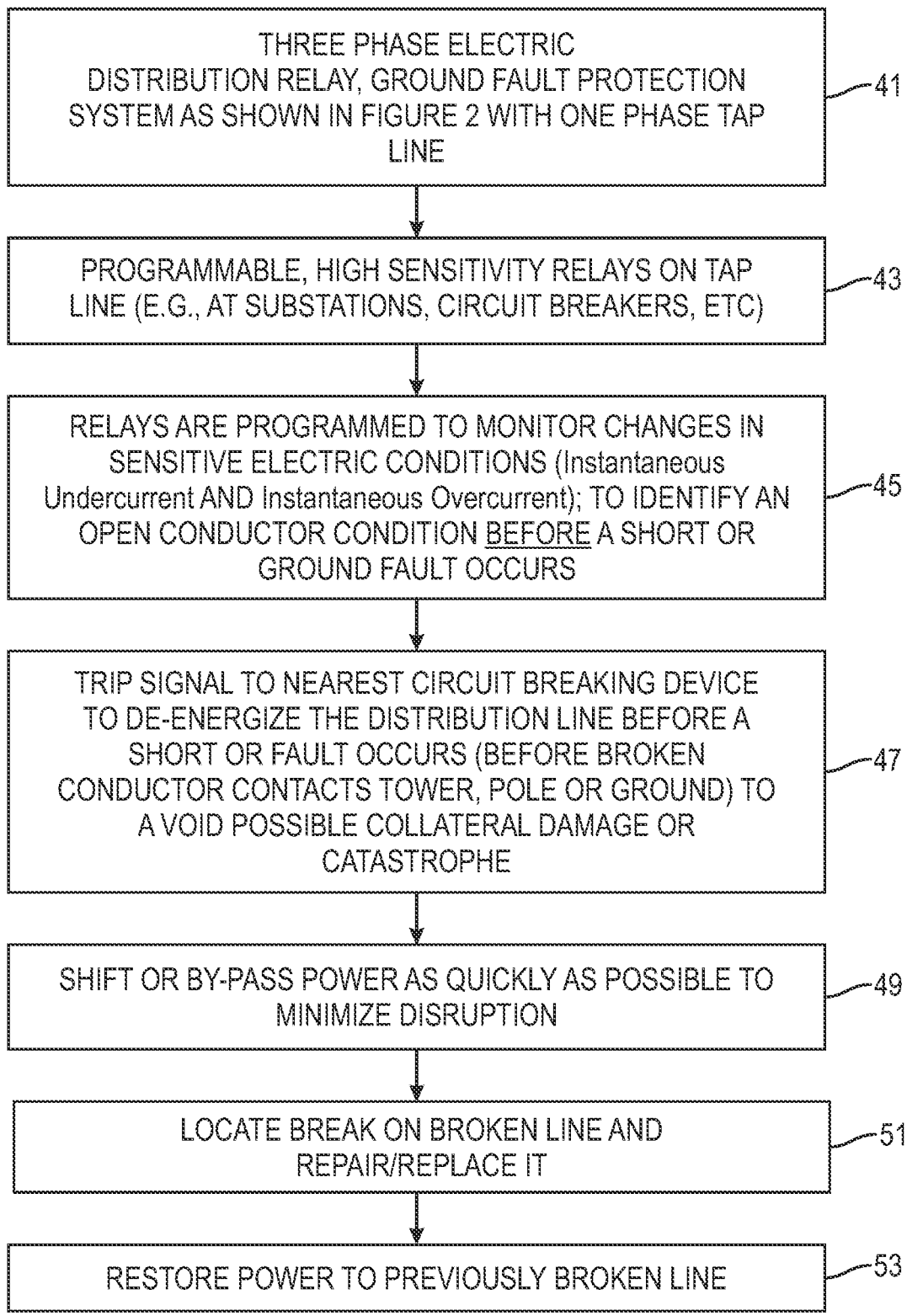
FIG. 3 is a block diagram showing some of the features of a Present Invention electric distribution relay protection system that includes high sensitivity relays included on single phase tap line, with small change monitoring of selected parameters.

By the present methods and devices, it can now be seen that the speed in which the monitoring and corrective action takes place is a fraction of a second or a second. Due to the present invention methods, shut down occurs before a fault occurs, no damage results, and easier, safer and quicker broken line repair is achieved. FIG. 3 illustrates a block diagram showing some of the features of a Present Invention electric distribution relay protection system 41 that includes high sensitivity relays included on a single-phase tap line, with small change monitoring of selected parameters:

(7) deploy programmable, high sensitivity relays along distribution tap lines, preferably at or near the substations, block 43. Signaling to circuit breaking devices must be very rapid, such as radio, direct wire or preferably optical fiber communications;

(8) program these high sensitivity relays to monitor micro changes in electric conditions, namely: a) instantaneous undercurrent; b) instantaneous overcurrent; and c) not shown in this Figure, but option yet preferred rate of change of current monitoring, along the single phase lines to identify when a line break has occurred and to do so before the broken line creates a fault, block 45, (before it touches a tower, pole or ground), e.g., within a half-second and preferably within a few milliseconds;

(9) rapidly signal to the appropriate circuit breaking devices to shut them down near the break before the ground fault has occurred, block 47 (again within a half-second and preferably within a few milliseconds) to avoid collateral damage or catastrophe, had the ground fault actually occurred;

(10) shift or by-pass (isolate) power as quickly as possible to minimize disruption, block 49 (this occurs with existing equipment and distribution configurations as the system may reconfigure);

(11) locate the broken line and repair/replace it, block 51, and;

(12) restore power to the previously broken line, block 53.

Figure 4:
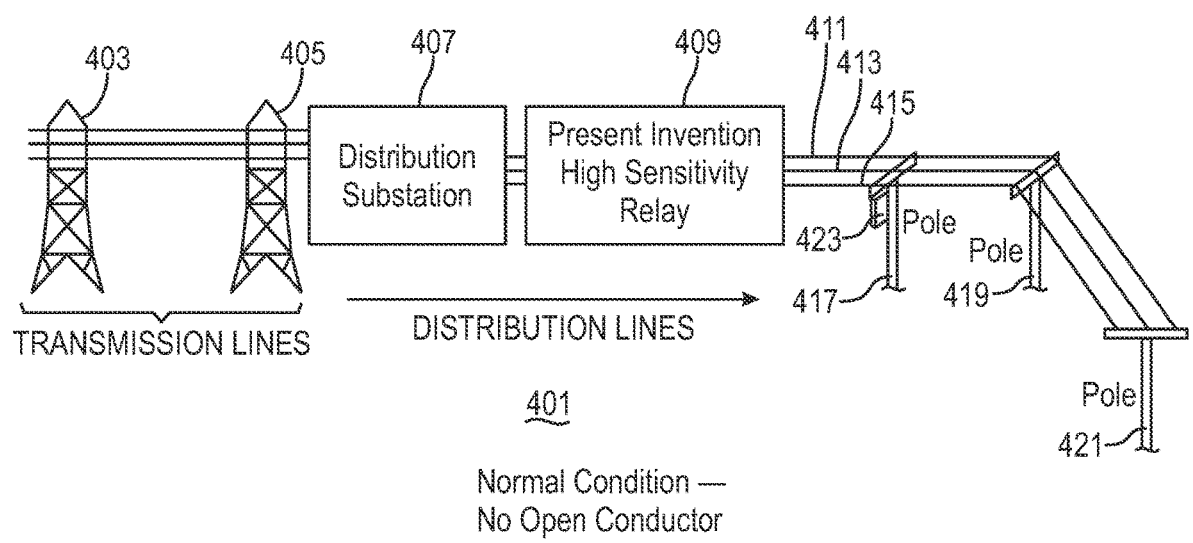
FIGS. 4 and 5 show electric distribution lines before a break and after a break (before shorting), respectively, with present invention relays (PIRs) at each substation and at other selected locations.
Figure 5:
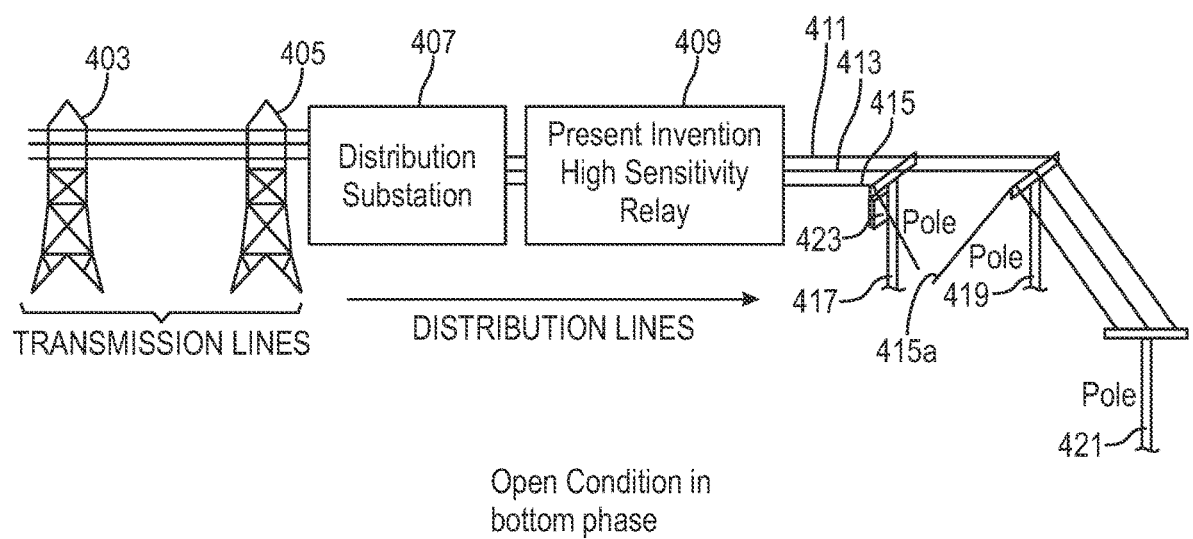

FIGS. 4 and 5 show electric distribution lines before a break and after a break (before shorting), respectively, with present invention relays (PIRs) at each substation and at other selected locations. These high sensitivity relays of the present invention are programmed differently from normal relays used in the industry, as they are programmed to measure sensitive readings and not large readings, and, more specifically, are programmed to measure/monitor changes that occur before fault occurs. These "micro" changes relate to what occurs at a broken line before either end touches anything to short or ground. Such readings are bypassed, or ignored, by the prior art systems programming, as breakers are not tripped in the prior art systems until after the short or fault occurs. Here the aforementioned conditions are monitored and when they deviate from the preset acceptable operating ranges, the breakers are tripped. These relays send trip signals to the circuit breaker(s) within a second, and even within 20 or so milliseconds to de-energize the line. In preferred embodiments, the present invention relays are programmed to monitor in both directions (upstream and downstream from current flow) and trip both related breakers. FIGS. 4 and 5 have identical numbers for identical components and are discussed here collectively. Incoming high voltage transmission lines on towers 403 and 405 feed electricity at very high voltages to step down transformer substations such as substation 407 and electricity therefrom is known as distribution system electricity on distribution lines 401. The distributed electricity passes through present invention relay 409 on lines 411, 413 and 415, on typical street poles 417, 419 and 421. There is shown a circuit breaker 423 functionally connected to relay 409. In FIG. 4, the illustrated system is at Normal Condition, with no open conductors (broken lines or shorted lines) shown. In FIG. 5, there is a broken line 415 at segment 415a. The present invention system relay recognizes the break through monitoring of the following operating conditions: (i) instantaneous undercurrent, and (ii) negative sequence overcurrent, and optional but preferred (iii) rate of change of current. The monitoring relay 409 recognizes the deviation(s) from acceptable ranges of these operating conditions (parameters) and via breaker 423, shuts down the power before the broken segment(s) ground out.

This shut down will occur in a fraction of a second, e.g., within a half-second and preferably within a few milliseconds. The existing relays are not capable of these measurements, reactions, etc. because they have neither adequate sensitivity, nor concomitant programming. In the present invention system, the shut down in response to the broken line is nearly instantaneous and certainly before the broken line segment(s) touch a pole or ground or other short. This generally happens in less than 25 milliseconds and completely prevents any short or ground from occurring and eliminates any collateral damage or worse-catastrophic damage to person, structure, animal, flora and fauna.

EXAMPLES OF PRESENT INVENTION MONITORING

FIGS. 6, 7, 8, 9, 10 and 11 show diagrammatic presentations of distribution lines with different present invention scenarios respectively, showing different breaks at relative locations and some possible present invention monitoring parameters/solutions. Specifically, these Figures show detailed settings for the present invention technology for different scenarios of where the conductor breaks in the distribution line. No matter where the conductor breaks, the present invention system will be able to detect the open conductor condition and trip either the main substation circuit breaker or a downstream line recloser. The highly sensitive relay elements will detect open conductors in the three-phase main lines and in the single-phase tap lines.

In FIGS. 6 through 9, all of the components are identical. Thus, this discussion of arrangements of line features and components for FIG. 6 applies to all FIGS. 6 through 9 inclusive. Viewing FIG. 6 from top to bottom, the system 601a, a normal condition, no open conductor illustration, shows a transmission line feeding electricity to a distribution transformer and a 12 kV bus. Current flows at 500 Amps peak from the distribution transformer. There is a present invention system high sensitivity relays, such as a Basler Flex relay, at the circuit breaker. A branch line shows a 50 amp load to the right, and one to the left shows a 100 amp load. Further down the distribution line, there is a line recloser with high sensitivity relays and a current flow of about 350 Amps peak. Below that, to the left, there is a branch line carrying a circuit breaker and only two 5 amp loads. End of the main line at the bottom likewise carries a 5 amp load.

Figure 6:
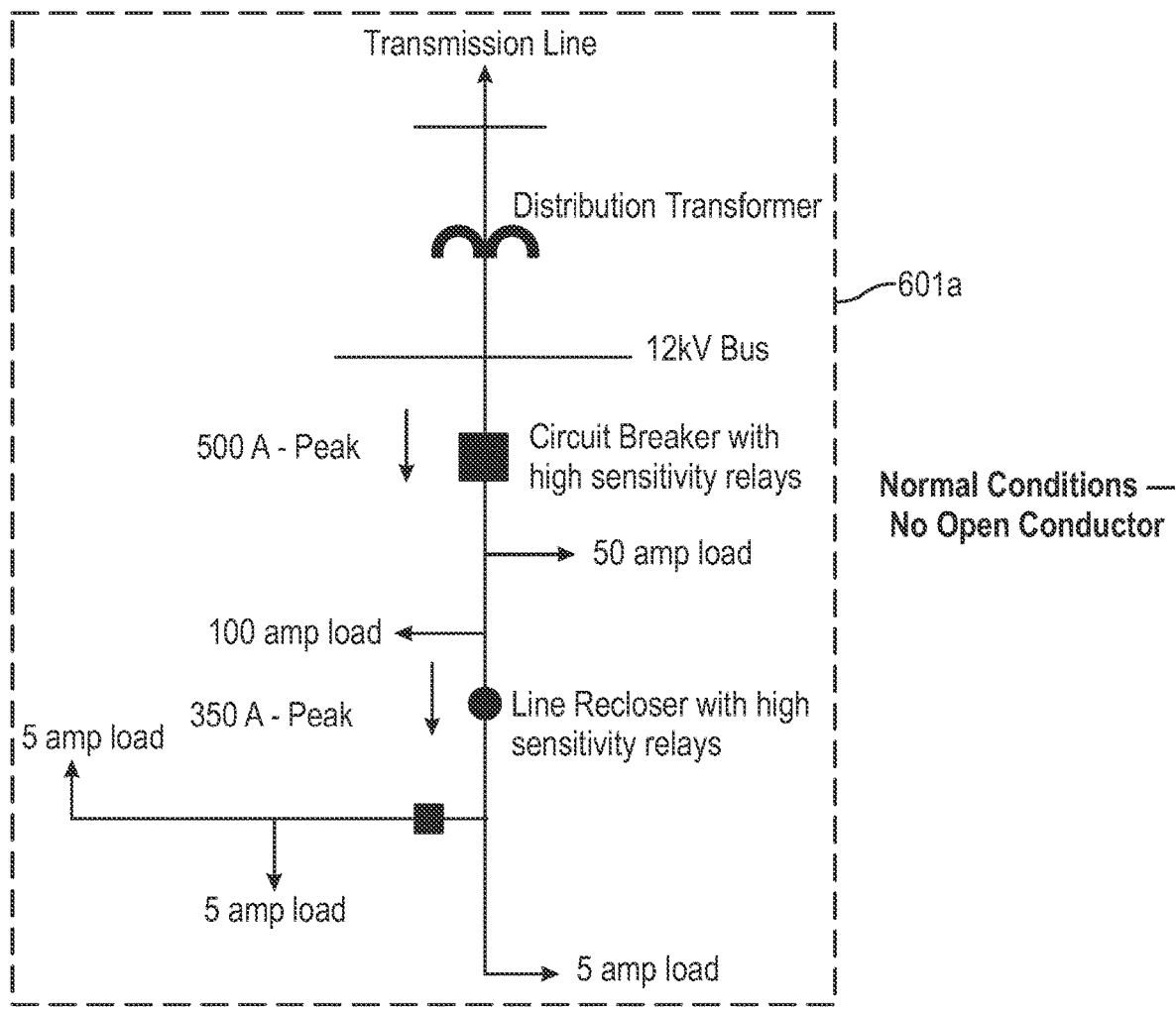
FIGS. 6, 7, 8, 9, 10 and 11 show diagrammatic presentations of distribution lines with different present invention scenarios respectively, showing different breaks at relative locations and some present invention monitoring parameters/solutions.
Figure 7:
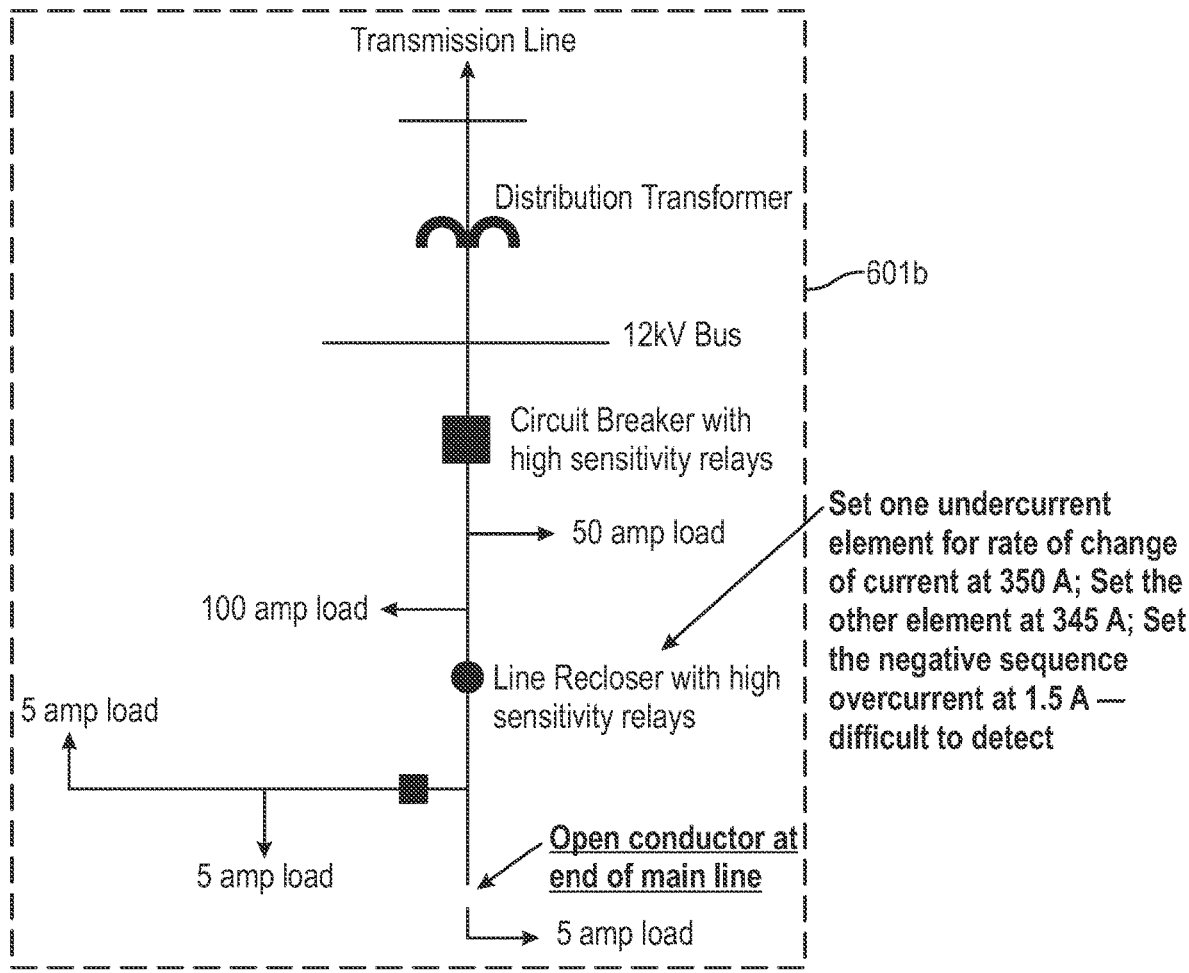

FIG. 7 shows the same diagram as FIG. 6, but with an open current at the end (bottom of FIG. 7) of the main line. As shown to the right of system frame 601b, an example present invention arrangement for monitoring this low amperage area of the distribution line would be to set one undercurrent for rate of change of current at 350 Amps, and the other element for change of rate of current at 345 Amps, and set the negative sequence overcurrent at 1.5 Amps. While it is difficult to detect a fault when current is at 5 Amps, these parameters enable the present invention system to monitor the line, recognize a deviation and shut down the power before an open line causes a fault.

Figure 8:
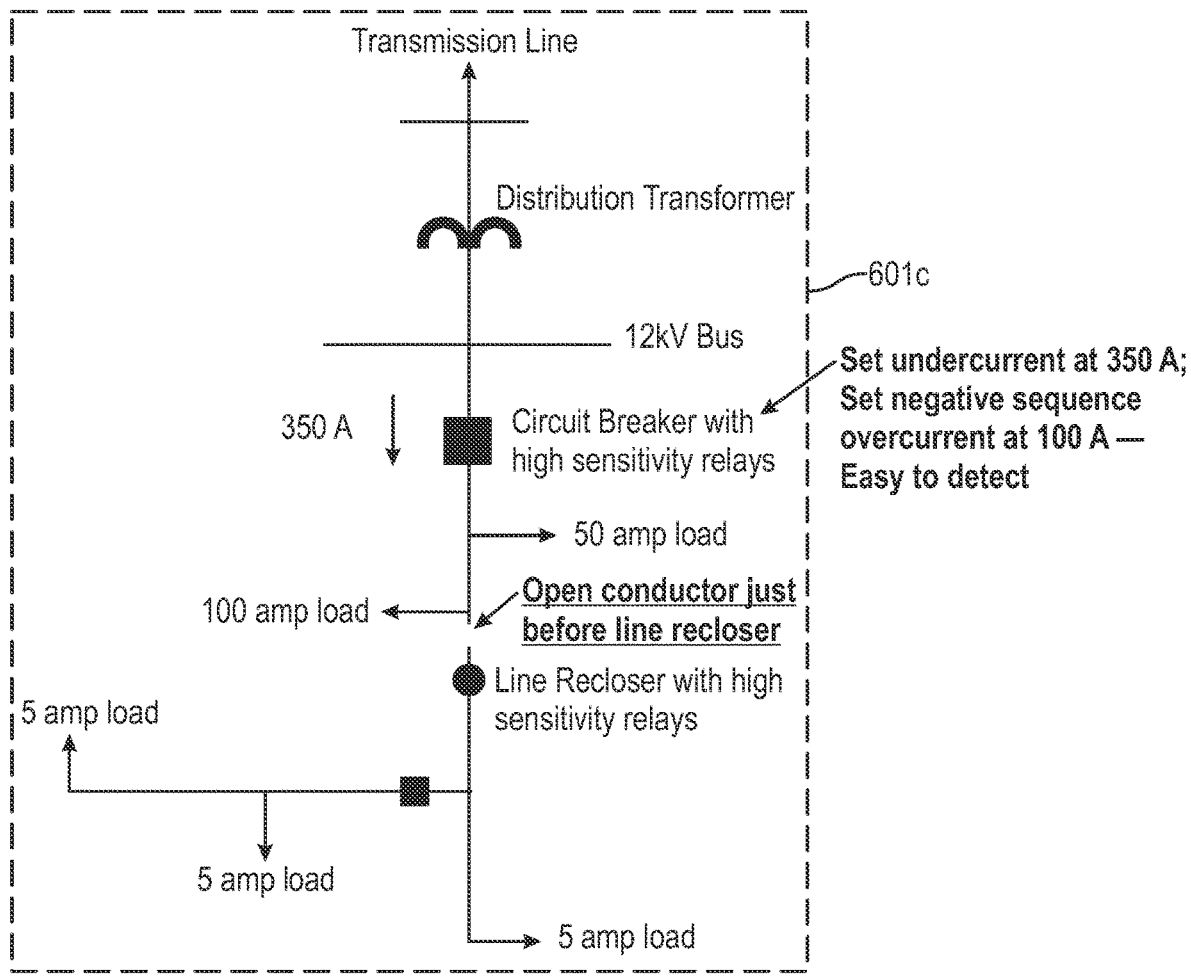

FIG. 8 shows the same diagram as FIG. 6, but with an open current just before the line recloser with high sensitivity relays (middle of FIG. 8) of the main line. As shown to the right of system frame 601c, an example present invention arrangement for monitoring this mid-range amperage area of the distribution line would be to set one undercurrent at 350 Amps and set the negative sequence overcurrent at 100 Amps. Here, it is easier to detect a fault when current is at or over about 100 Amps. These parameters enable the present invention system to monitor the line, recognize a deviation and shut down the power before an open line causes a fault.

Figure 9:
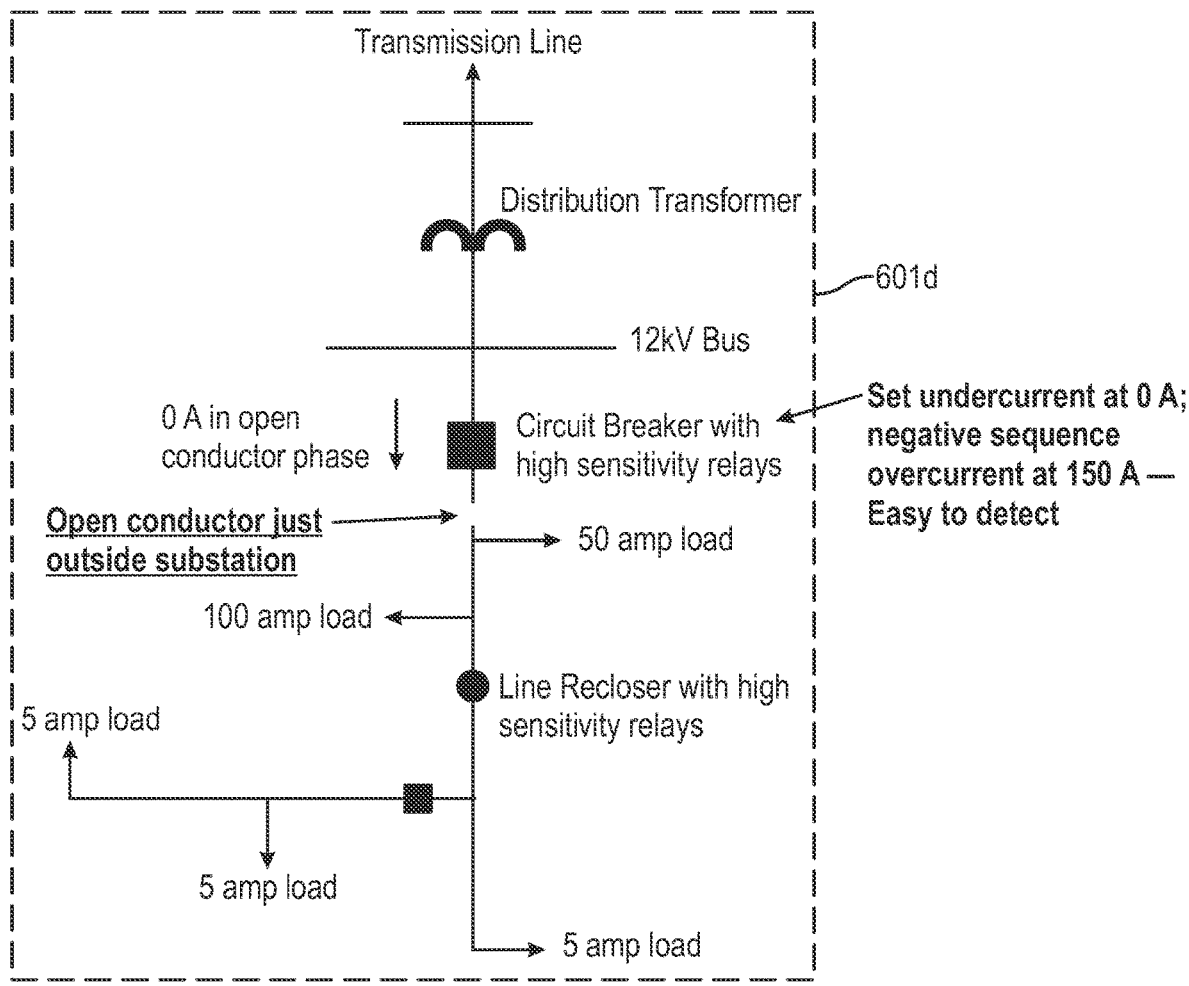

FIG. 9 shows the same diagram as FIG. 6, but with an open current near the substation (middle of FIG. 9) of the main line. As shown to the right of system frame 601d, an example present invention arrangement for monitoring this amperage area of the distribution line would be to set one undercurrent at 0 Amps, and set the negative sequence overcurrent at 150 Amps. Here, it is easier to detect a fault when current is over about 100 Amps. These parameters enable the present invention system to monitor the line, recognize a deviation and shut down the power before an open line causes a fault.

Figure 10:
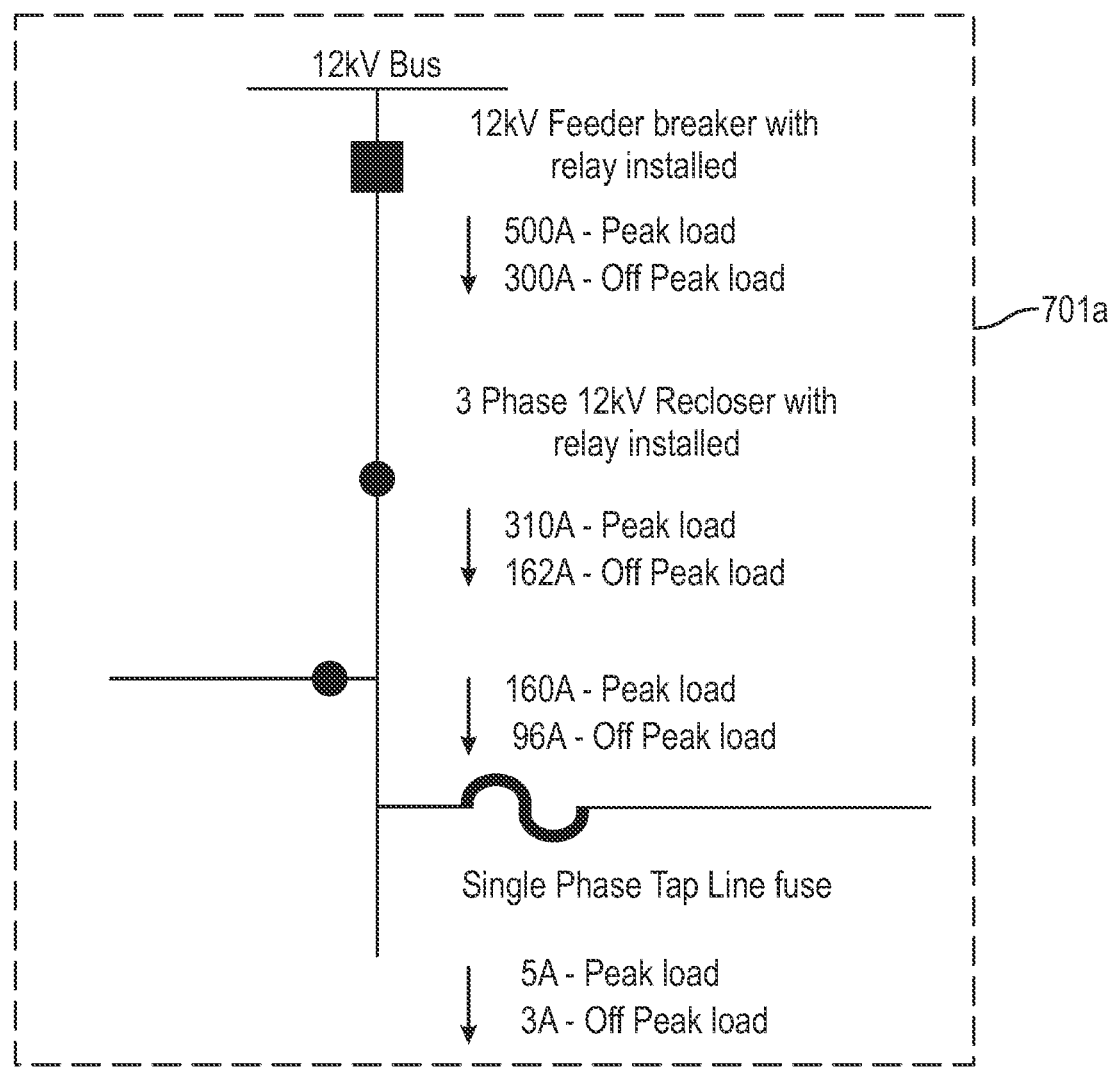
Figure 11:
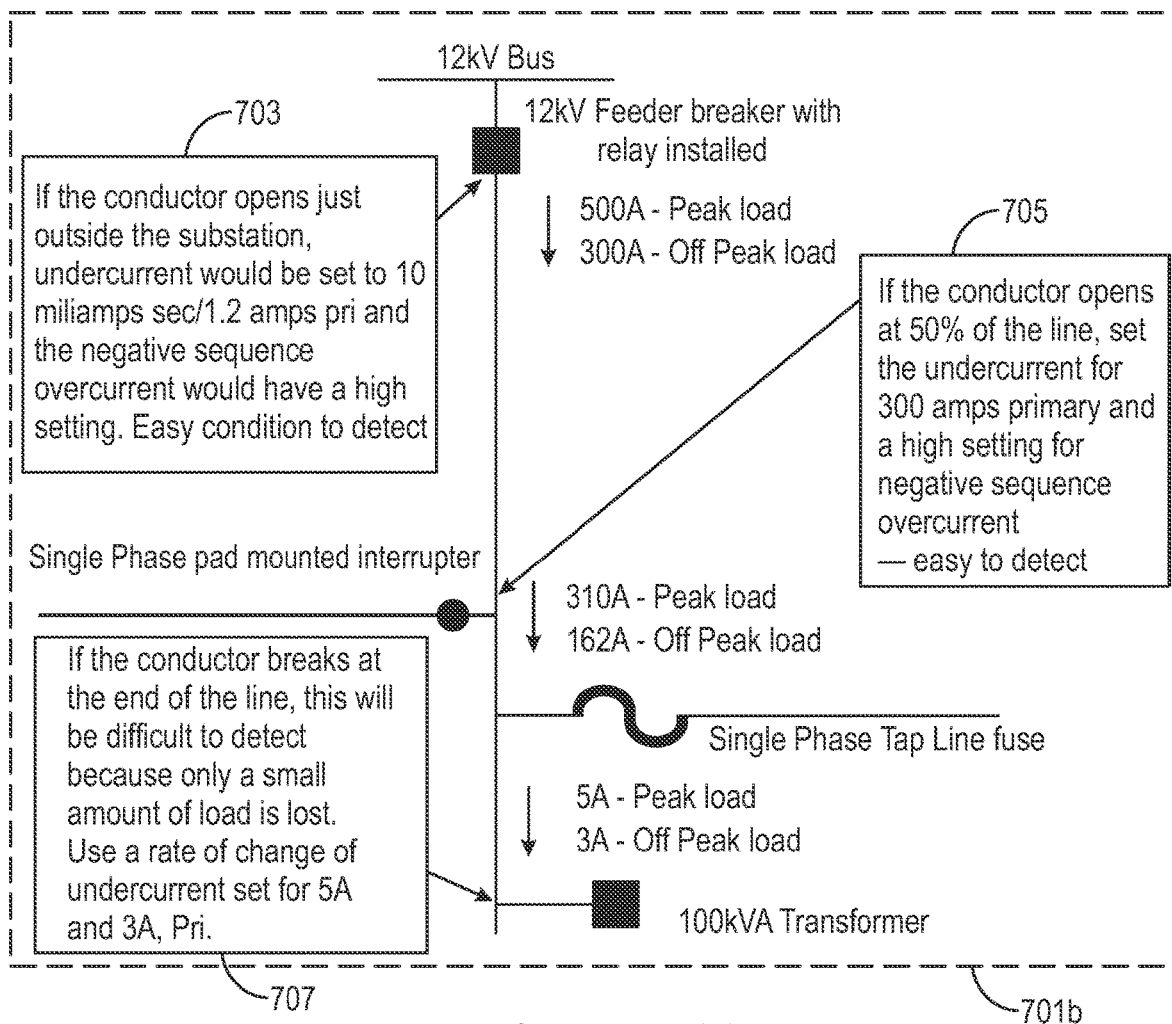

FIGS. 10 and 11 show another example of a present invention system. FIG. 10 shows the present invention system 701a in normal mode with no open conductors. FIG. 11 shows the present invention system 701b with solutions set forth on frames 703, 705 and 707, which are using the arrangements above with the logic shown in FIGS. 12 and 13 to initiate the frame 703, 705 and 707 solutions.

The present invention for detecting open conductors in distribution circuits is unique and unprecedented. This protection will work for any distribution feeder of any length and voltage. The logic utilizes extremely sensitive undercurrent and negative sequence overcurrent protection coupled with internal logic elements unique to the Basler Flex relay to detect open conductors in three phase lines and single phase tap lines fed from the three phase main line.

(Such relays, which may be utilized in all present invention embodiments, but are not programmed as in the present invention to monitor the specific characteristics of the present inventions systems, have sufficient inputs, programmability and high sensitivity (very low reading capability) that they may be modified (programmed) for present invention applications. Low readings of 0.01 amps and even 0.001 amps, are preferred.)

This invention uses a combination of extremely sensitive undercurrent relay elements combined with extremely sensitive negative sequence overcurrent relay elements to sense whether a conductor has opened or not and initiate a trip signal to the main feeder circuit breaker of downstream circuit recloser to deenergize the circuit almost immediately before either end of the open conductor makes contact with the ground or touches a grounded structure. Discussion of this invention will be broken into discussion of three phase main line open conductor protection and single phase tap line open conductor protection.

Figure 12:
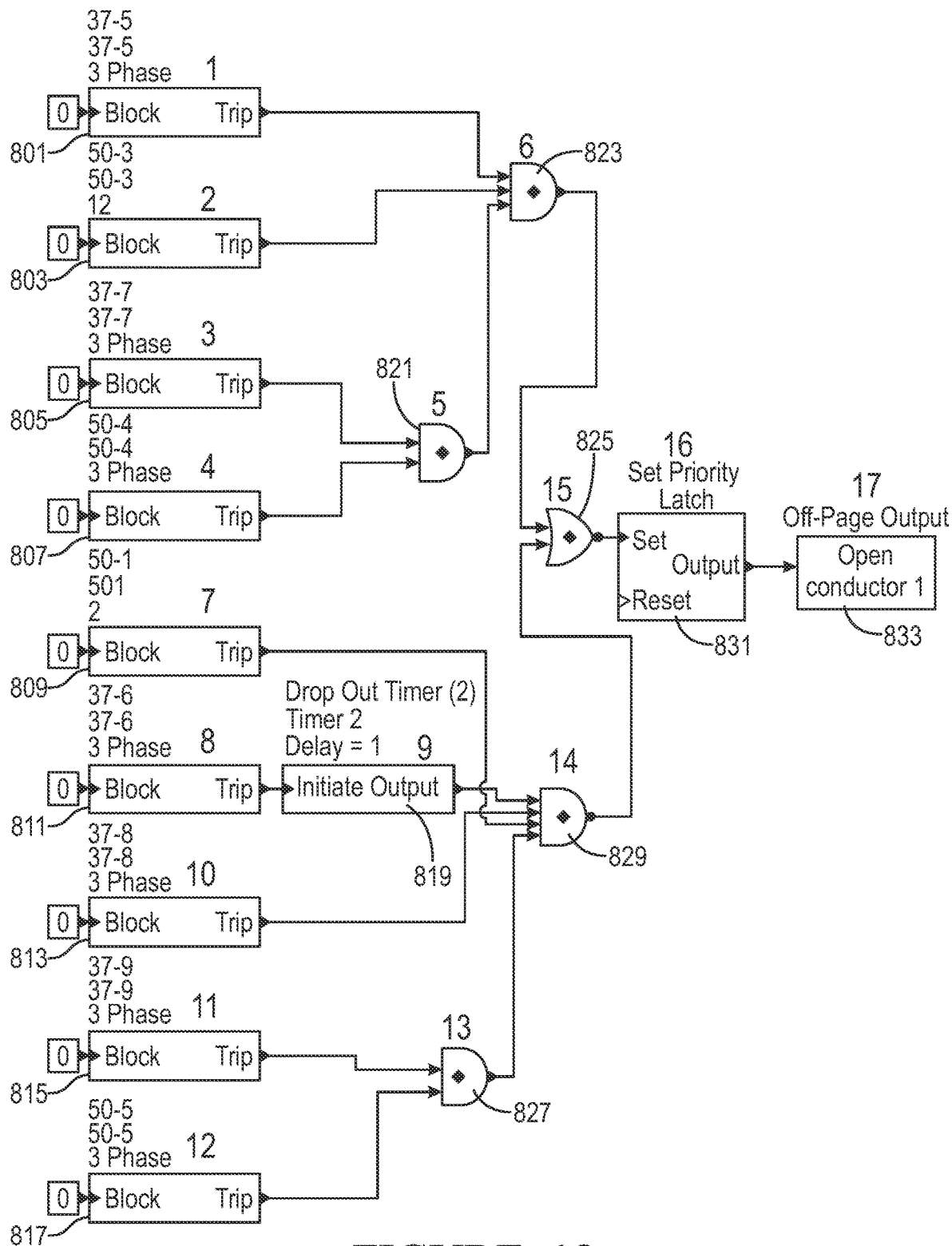
FIGS. 12 and 13, respectively, show various present invention AND gate/OR gate arrangements programmed into the high sensitivity relays used to monitor conditions and initiate breaker tripping to prevent ground faults after a line break and before a line touches any ground.

Three Phase Main Line Logic: FIG. 12 is a diagram of one preferred present invention logic arrangement for a three-phase main line logic. Blocks 801 through 819 are various logic inputs from readings of the High sensitivity relays used in the present invention systems. As can be seen in FIG. 12, there are two groupings of input blocks, the first being blocks 801, 803, 805 and 807; the second being blocks 809, 811, 813, 815, 817 and 819. The first part of this logic diagram shows an And gate, block 823, with three inputs: First input is from an undercurrent relay element (37-5) (Block 801); the second input is from a negative sequence overcurrent relay element (Block 803); and the third input is And gate, Block 821, which is from bracketing logic (as described in the single phase logic detection below). This And gate 821 is receiving inputs from block 805, undercurrent, and block 807, negative sequence overcurrent, but at different readings from blocks 802 and 803, such as described in previous figures. Thus, output of And gate (Block 823) will go to an Or gate (Block 825) which also receives feed from a 4 input And gate (Block 829). Block 829 is fed from a negative sequence overcurrent relay (Block 809), from Blocks 811 and 819 (rate of change of current) and Blocks 815 (undercurrent), 817 (negative sequence overcurrent) and And gate 827 (bracketing logic). Thus, the output of Or Gate (Block 825) will then send a trip signal to the distribution feeder breaker or downstream circuit recloser (not shown) and de-energize broken conductor 833, before it grounds out. Block 809 (negative sequence overcurrent) is there to provide additional security, however, if it determined that it is difficult to set this block it can be bypassed and the logic will be secure to send a trip signal.

Figure 13:
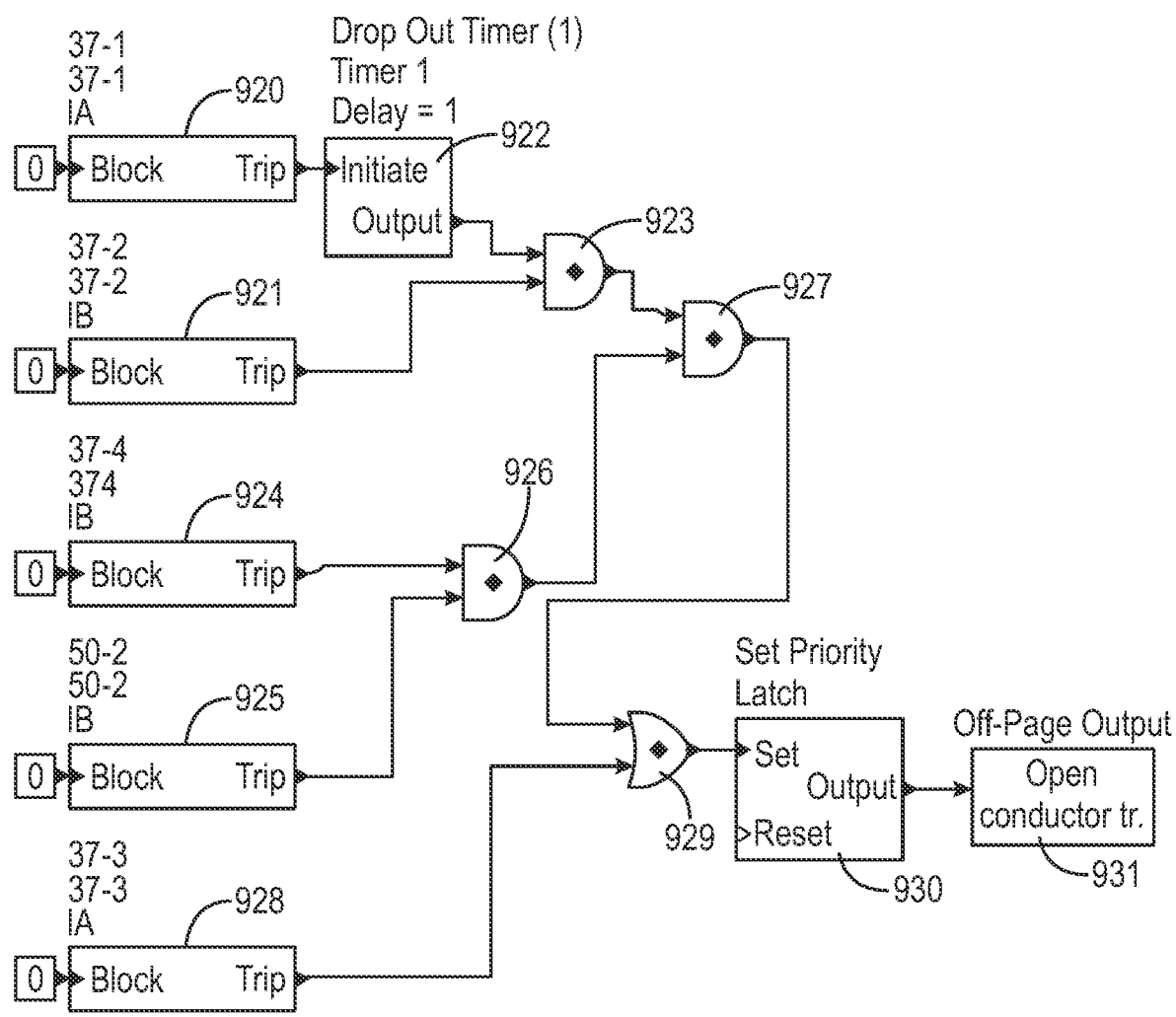

Single Phase Tap Line Logic: FIG. 13 is a logic diagram of the single phase tap line logic to be employed in the present invention with Basler Flex type high sensitivity relays.

The first part of the FIG. 13 diagram above depicts rate of change of current logic that can differentiate between normal load current and a rapid change in load current. The first undercurrent element (37-1) output (block 920) would be set for realistic load current on the tap line which is then sent to a dropout timer (block 922) with a 1 second time delay dropout. The second undercurrent element (37-2) output (block 921) would be set for a lower current than block 920 is set for representing a minimum loss of load. The output of block 921 would then be sent to an And gate (block 923). Note that the instantaneous undercurrent relay can accurately detect an extremely small loss of load (0.01 amps). The output of And gate (block 923) is then sent to Block 927 (another And gate). The other input of the And gate (block 927) is fed from an And gate (Block 926). This And gate (Block 926) is fed from a combination of another undercurrent relay (Block 924) and a single phase overcurrent relay (Block 925). This logic is "bracketing logic" that establishes a realistic range of load current from peak to off-peak load conditions. This logic will be able to accurately detect a very small window of load currents to ensure the reliability and security of the "rate of change of current" logic. The output of Block 927 (And gate) is then fed to Or gate (Block 929). The other end of the Or gate (Block 929) is fed another instantaneous undercurrent relay (Block 928) which will be set for (0.01 amps) and will be able to reliably detect an open conductor immediately adjacent to the relay location. When an open conductor 931 occurs, the output of Or Gate (Block 929) will then send a trip signal to the distribution feeder breaker or downstream circuit recloser (not shown) and de-energize broken conductor 931, before it grounds out.

To summarize the "single phase" open conductor logic will be able to reliably detect an open conductor in a single phase tap line immediately on the load side of the interrupting device (relay location) and the end of line using extremely sensitive and accurate rate of change of current detection. This then would protect 100% of the single phase line for open conductors.

Although particular embodiments of the invention have been described in detail herein with reference to the accompanying drawings, it is to be understood that the invention is not limited to those particular embodiments, and that various changes and modifications may be affected therein by one skilled in the art without departing from the scope or spirit of the invention as defined in the appended claims. For example, the shapes of the various components herein may be changed; specific relays may be modified or enhanced; communications may be by radio or fiber optics or by any rapid communication system that is or becomes available.

What is claimed is:

1. A system for preventing ground fault or other short circuit in electric distribution line system, caused by a break in a line, which utilizes at least dual high sensitivity monitoring, which comprises:
   A. a three-phase electric distribution line system having a plurality of circuit breaking devices and transformers;
   B. a plurality of relay devices connected to said distribution line system, said plurality of relay devices having a best sensitivity for measuring line instantaneous undercurrent of at least 0.01 amps or lower amps, and thereby being high sensitivity relay devices, wherein at least some of said plurality of relay devices are connected to at least some of said plurality of circuit breaking devices;
   C. a programmable relay protection system functionally connected to said three-phase electric distribution line system, including functionally connected to said plurality of relay devices on each line of said electric distribution line system, said relay protection system being programmed to include:
      a) preset parameter ranges of at least two high sensitivity electric operating conditions, said preset ranges being acceptable operating parameter ranges, one of said operating conditions being instantaneous undercurrent, and one other of said operating conditions being negative sequence overcurrent;
      b) monitoring means to monitor each line at each of said plurality of relay devices for said at least two operating conditions;
      c) permitting closed circuit operation when all of said lines show said at least two operating conditions are within said preset acceptable operating parameter ranges;
      d) sensing open conductor broken line changes and tripping a circuit breaking device on a broken line when that line shows said at least two operating conditions are outside said preset parameter ranges;
      e) and completing the sensing and tripping within 1.0 second.

2. The system for preventing ground fault or other short circuit in a three-phase electric distribution line system of claim 1 wherein said some of said relays are connected to said circuit breaking device selected from the group consisting of substation circuit breakers, non-substation circuit breakers, line reclosers, tap lines and combinations thereof.

3. The system for preventing ground fault or other short circuit in a three-phase electric distribution line system of claim 1 wherein said preset parameter ranges of at least two high sensitivity electric operating conditions are three preset parameter ranges, said three preset ranges being acceptable operating parameter ranges of (i) instantaneous undercurrent, (ii) negative sequence overcurrent, and (iii) rate of change of current.

4. The system of claim 1 wherein said sensing and reporting and tripping of a circuit breaking device is completed within 1.0 second.

5. The system for preventing ground fault or other short circuit in a three-phase electric distribution line system of claim 1 wherein said programmable relay protection system plurality of relay devices are programmed to monitor high sensitivity line instantaneous undercurrent, and to monitor high sensitivity negative sequence overcurrent to detect current imbalance of the load wherein one of the three phases has opened.

6. The system for preventing ground fault or other short circuit in a three-phase electric distribution line system of claim 4 wherein shutting down the power to said broken line is delayed by a preset time within the range of about 0.3 seconds to about 1 second to protect against a false shut down.

7. The system for preventing ground fault or other short circuit in a three-phase electric distribution line system of claim 1 wherein said plurality of relay devices are programmed to be highly sensitive so as to monitor and measure instantaneous undercurrent in the range of 0.01 to 1 amp.

8. The system for preventing ground fault or other short circuit in a three-phase electric distribution line system of claim 1 wherein said plurality of relay devices are programmed to be highly sensitive so as to monitor and measure negative sequence overcurrent in the range of 0.01 to 1 amp.

9. The system for preventing ground fault or other short circuit in a three-phase electric distribution line system of claim 3 wherein said plurality of relay devices are programmed to be highly sensitive so as to monitor and measure instantaneous undercurrent in the range of 0.01 to 1 amp.

10. The system for preventing ground fault or other short circuit in a three-phase electric distribution line system of claim 3 wherein said rate of changes of current is measured in time increments of about 0.5 to about 1.2 seconds.

11. The system for preventing ground fault or other short circuit in a three-phase electric distribution line system of claim 9 wherein said rate of changes of current is measured in time increments of about 0.8 to about 1 second.

12. The system for preventing ground fault or other short circuit in a three-phase electric distribution line system of claim 1 wherein said relay protection system includes sufficient software and hardware for recognizing line breakage within 10 milliseconds when said at least one operating condition falls outside of said preset parameter ranges, and communicating to open the circuit breaking device on said broken line within 10 milliseconds, thereby shutting down power to said broken line before it otherwise causes a ground fault or other short circuit.

13. The system for preventing ground fault or other short circuit in a three-phase electric distribution line system of claim 1 wherein said system further includes single-phase tap lines, and said single phase tap lines are monitored lines wherein a plurality of additional relays are located on said single-phase tap lines, and further wherein said additional relays located on said single phase tap lines are programmed to monitor three preset parameter ranges, said three preset ranges being acceptable operating parameter ranges of (i) instantaneous undercurrent, (ii) instantaneous single phase overcurrent, and (iii) rate of change of current.

14. The system for preventing ground fault or other short circuit in a three-phase electric distribution line system of claim 13 wherein said rate of changes of current is measured in time increments of about 0.5 to about 1.2 seconds.

15. The system for preventing ground fault or other short circuit in a three-phase electric distribution line system of claim 14 wherein said rate of changes of current is measured in time increments of about 0.8 to about 1 second.

16. The system for preventing ground fault or other short circuit in a three-phase electric distribution line system of claim 1 wherein there are at least two AND gates and at least one OR gate for processing monitored data readings and tripping breakers, including a first AND gate that receives line instantaneous undercurrent readings and line negative sequence overcurrent readings, and includes a second AND gate that receives line instantaneous undercurrent readings and line instantaneous overcurrent readings with a different, second set of parameter ranges than said first AND gate.

17. The system for preventing ground fault or other short circuit in a three-phase electric distribution line system of claim 1 wherein there are at least three AND gates and at least one OR gate for processing monitored data readings and tripping breakers, including a first AND gate that receives line instantaneous undercurrent readings and line negative sequence overcurrent readings, and includes a second AND gate that receives line instantaneous undercurrent readings and line instantaneous overcurrent readings with a different, second set of parameter ranges than said first AND gate, and a third AND gate that receives at least two line parameters including a first line instantaneous undercurrent and a time-delayed second instantaneous undercurrent for monitoring the rate of change of current.

18. The system for preventing ground fault or other short circuit in a three-phase electric distribution line system of claim 16 wherein said third AND gate also receives at least one additional line parameter, including instantaneous undercurrent readings.

19. The system for preventing ground fault or other short circuit in a three-phase electric distribution line system of claim 1 wherein there are at least four AND gates and at least one OR gate for processing monitored data readings and tripping breakers, including a first AND gate that receives line instantaneous undercurrent readings and line negative sequence overcurrent readings, and includes a second AND gate that receives line instantaneous undercurrent readings and line instantaneous overcurrent readings with a different, second set of parameter ranges than said first AND gate, and a third AND gate that receives at least two line parameters including a first line instantaneous undercurrent and a time-delayed second instantaneous undercurrent for monitoring the rate of change of current, and a fourth AND gate that receives line instantaneous undercurrent readings and line instantaneous overcurrent readings.

20. The system for preventing ground fault or other short circuit in a three-phase electric distribution line system of claim 18 wherein said third AND gate also receives at least one additional line parameter, including instantaneous undercurrent readings.

\* \* \* \* \*